(12) United States Patent
Hsieh

(10) Patent No.: US 9,144,184 B1
(45) Date of Patent: Sep. 22, 2015

(54) NOISE SUPPRESSION DEVICE

(71) Applicant: Tse-Wei Hsieh, New Taipei (TW)

(72) Inventor: Tse-Wei Hsieh, New Taipei (TW)

( * ) Notice: Subject to any disclaimer, the term of this patent is extended or adjusted under 35 U.S.C. 154(b) by 22 days.

(21) Appl. No.: 14/217,533

(22) Filed: Mar. 18, 2014

(51) Int. Cl.
H05K 9/00 (2006.01)

(52) U.S. Cl.
CPC ............ *H05K 9/0007* (2013.01); *H05K 9/0066* (2013.01); *H05K 9/0084* (2013.01)

(58) Field of Classification Search
CPC ............................. H05K 9/0007; H05K 9/0066
See application file for complete search history.

(56) References Cited

U.S. PATENT DOCUMENTS

| | | | |
|---|---|---|---|
| 2005/0118874 A1* | 6/2005 | Lin ................................ 439/620 |
| 2005/0164525 A1* | 7/2005 | Benson et al. ................... 439/63 |
| 2007/0013461 A1* | 1/2007 | Montena ........................ 333/185 |
| 2008/0100400 A1* | 5/2008 | Lucas ........................... 333/181 |
| 2010/0314150 A1* | 12/2010 | Song et al. ...................... 174/59 |
| 2011/0031006 A1* | 2/2011 | Chen et al. ..................... 174/350 |
| 2012/0177377 A1* | 7/2012 | Feldstein et al. ............... 398/135 |
| 2012/0205367 A1* | 8/2012 | Kawai et al. ................... 220/4.21 |
| 2013/0002104 A1* | 1/2013 | Chen ........................... 312/223.1 |
| 2013/0085402 A1* | 4/2013 | Callahan et al. ................ 600/509 |
| 2013/0100571 A1* | 4/2013 | Alkan et al. ................... 361/118 |
| 2013/0112453 A1* | 5/2013 | Lien ................................ 174/50 |
| 2014/0097021 A1* | 4/2014 | Su ................................ 174/72 R |

* cited by examiner

*Primary Examiner* — Hung V Ngo
(74) *Attorney, Agent, or Firm* — Alan D. Kamrath; Kamrath IP Lawfirm, P.A.

(57) ABSTRACT

A noise suppression device includes a housing having a chamber, a tube mounted in the chamber of the housing, a mineral layer mounted in the chamber of the housing, an absorbing layer mounted in the tube, a cylinder mounted in the absorbing layer, and a cover mounted on an opened end of the housing to close the housing. Thus, the noise suppression device has an excellent grounding effect by provision of the cylinder which is made of copper, so that when the noise suppression device is connected with the sound, the sound is grounded and can release the induced charges produced by various radiation and electromagnetic induction. In addition, the voltage noise produced in the acoustic signals of the sound is oscillated in the noise suppression device, so as to achieve the purpose of eliminating the voltage noise.

8 Claims, 6 Drawing Sheets

NOISE SUPPRESSION DEVICE

BACKGROUND OF THE INVENTION

1. Field of the Invention

The present invention relates to a suppression device and, more particularly, to a noise suppression device to eliminate noise (or glitch) produced in an electric appliance, such as a sound and the like.

2. Description of the Related Art

An electric appliance, such as a sound, television, monitor, video player and the like, includes an electrical signal cable to execute the purpose of transmission and indication. The electrical signal cable is easily affected by various noises, such as a grounding circuit noise, an electromagnetic radiation interference noise, and a power supply interference noise. Concerning the grounding circuit noise, the sound system needs a greater grounding effect (the grounding resistance has to be smaller than four ohms) to release the induced charges produced by various radiation and electromagnetic induction, to prevent the voltage noise from overlapping the acoustic signals. Concerning the electromagnetic radiation interference noise, the environmental electromagnetic wave interference (such as the high frequency electromagnetic radiation interference from the cell phone) is mixed with the transmission signal through the acoustic transmission cable to form a noise. Concerning the power supply interference noise, different facilities, such as optical regulating devices, air-conditioning devices, motors and the like, merge at the common electrical grid to produce peak impulses, surge currents and voltages of different frequency in the power line, which will pass through the power line into the power supply of the sound, thereby forming a noise in the sound. For solving the above-mentioned noise problems, the power line is processed by a special shelter treatment to eliminate the electronic radiation interference efficiently. The facilities with serious magnetic leakage are enclosed by an iron cabinet to eliminate the magnetic radiation. A purified alternating power supply can efficiently filter and eliminate the interference signals in the power line.

BRIEF SUMMARY OF THE INVENTION

The primary objective of the present invention is to provide a noise suppression device having an excellent grounding effect to release the induced charges produced by the sound.

In accordance with the present invention, there is provided a noise suppression device comprising a housing having an interior provided with a chamber, a tube mounted in the chamber of the housing, a mineral layer mounted in the chamber of the housing, an absorbing layer mounted in the tube, a cylinder mounted in the absorbing layer, and a cover mounted on an opened end of the housing to close the housing. The cylinder has an outer periphery provided with an electroplated layer. The cylinder has an end provided with a connecting portion. The absorbing layer is mounted on the outer periphery of the cylinder. The tube is mounted on an outer periphery of the absorbing layer. The chamber of the housing is mounted on an outer periphery of the tube. The cover is provided with an opening connected to the connecting portion of the cylinder.

Preferably, the cylinder has a side provided with at least one fixing portion connected to the connecting portion.

Preferably, the cylinder is made of copper.

Preferably, the electroplated layer of the cylinder is made of silver.

Preferably, the absorbing layer is made of absorbent material that absorbs and prevents high-frequency and low-frequency waves.

Preferably, the tube is made of aluminum.

Preferably, the chamber of the housing has a peripheral wall provided with a plurality of arcuate channels surrounding and abutting the outer periphery of the tube to fix the tube.

Preferably, the housing has an outer periphery provided with an antiskid layer.

According to the primary advantage of the present invention, the noise suppression device has an excellent grounding effect by provision of the cylinder which is made of copper, so that when the noise suppression device is connected with the sound, the sound is grounded and can discharge and release the induced charges produced by various radiation and electromagnetic induction.

According to another advantage of the present invention, the absorbing layer absorbs high-frequency and low-frequency waves, while the mineral layer is located between the housing and the tube, so that the voltage noise produced in the acoustic signals of the sound is oscillated in the noise suppression device, so as to achieve the purpose of eliminating the voltage noise.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

DETAILED DESCRIPTION OF THE INVENTION

Figure 1:
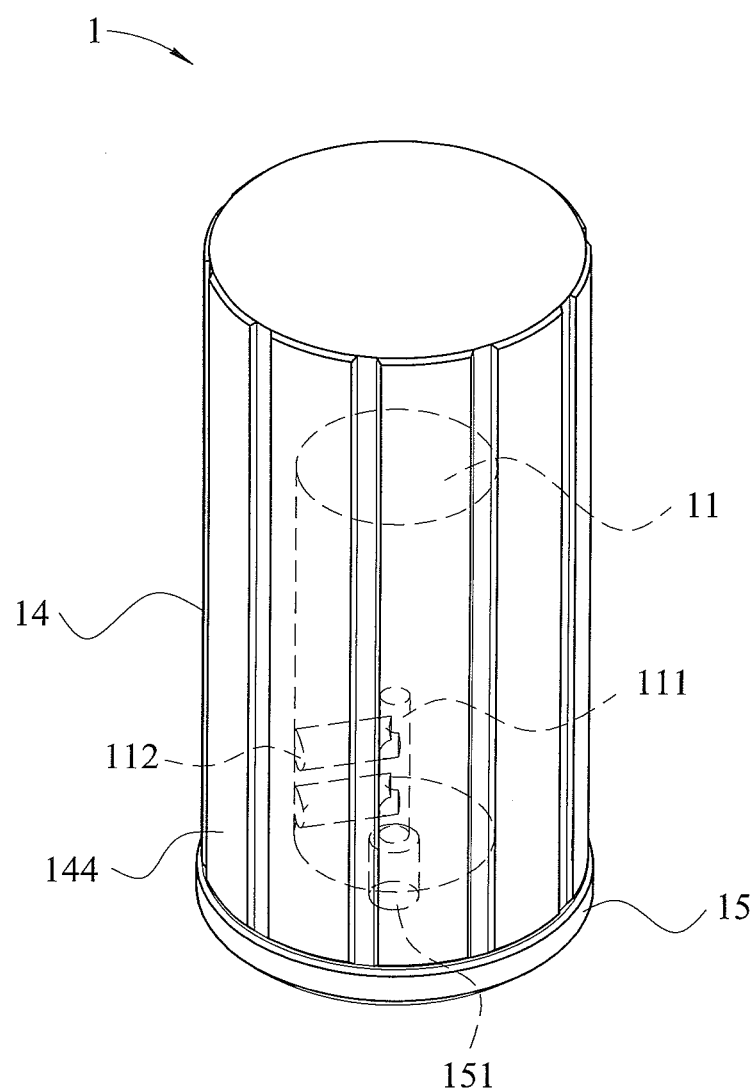
FIG. 1 is a perspective view of a noise suppression device in accordance with the preferred embodiment of the present invention.
Figure 2:
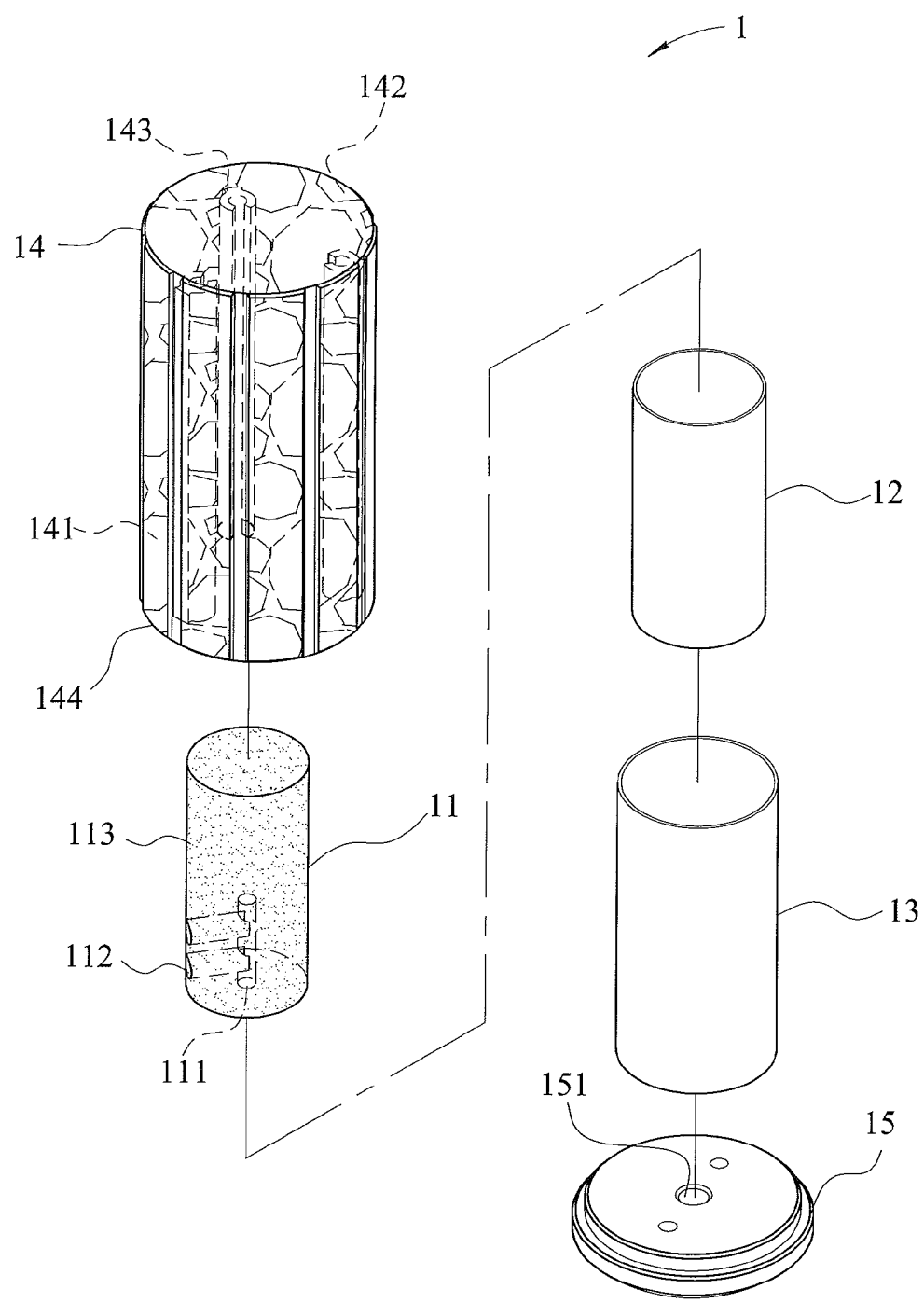
FIG. 2 is an exploded perspective view of the noise suppression device as shown in FIG. 1.
Figure 3:
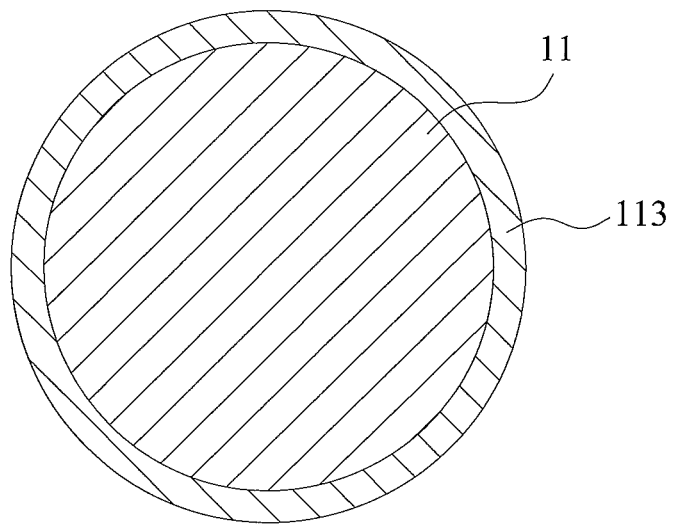
FIG. 3 is a top cross-sectional view of a cylinder of the noise suppression device as shown in FIG. 2.
Figure 4:
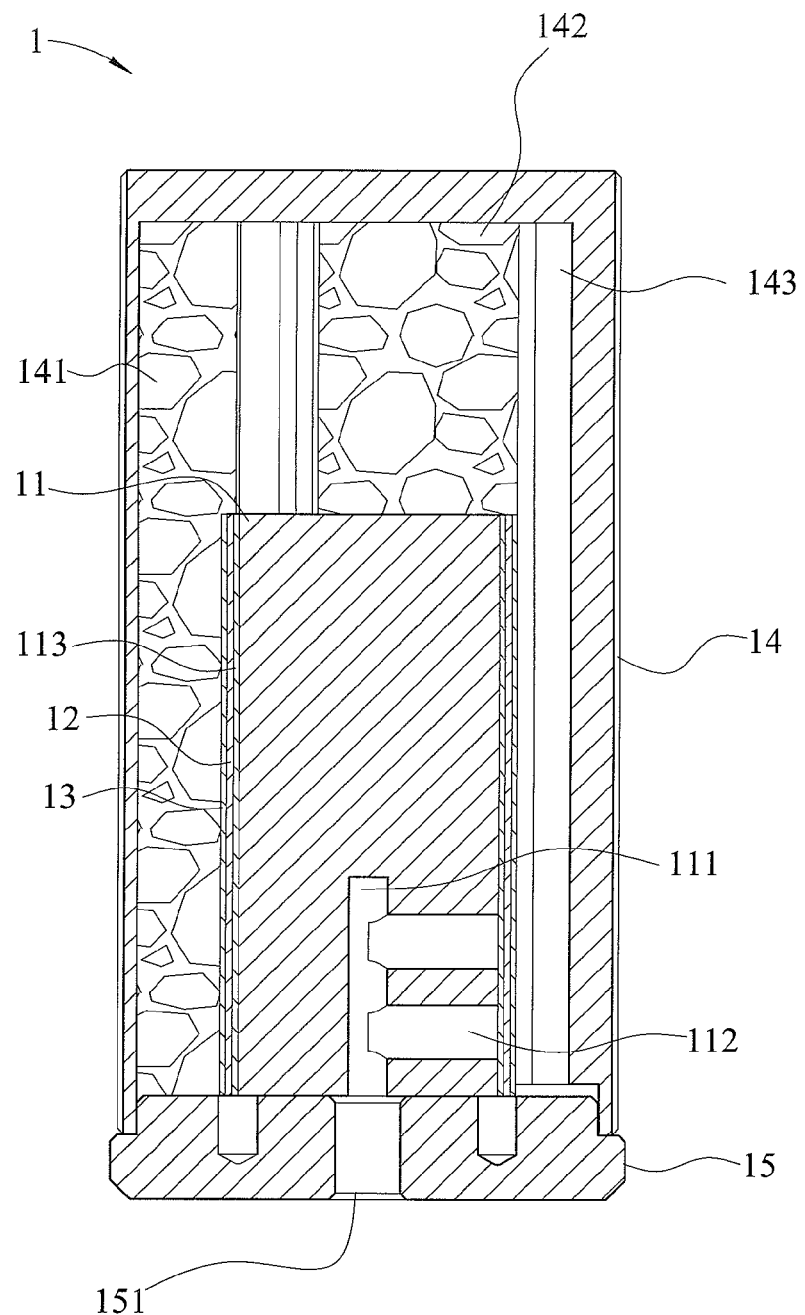
FIG. 4 is a front cross-sectional view of the noise suppression device as shown in FIG. 1.

Referring to the drawings and initially to FIGS. 1-4, a noise suppression device 1 in accordance with the preferred embodiment of the present invention comprises a housing 14 having an interior provided with a chamber 141, a tube 13 mounted in the chamber 141 of the housing 14, a mineral layer 142 mounted in the chamber 141 of the housing 14, an absorbing layer 12 mounted in the tube 13, a cylinder 11 mounted in the absorbing layer 12, and a cover 15 mounted on an opened end of the housing 14 to close the housing 14.

The cylinder 11 is made of copper and has an outer periphery provided with an electroplated layer 113. The electroplated layer 113 of the cylinder 11 is made of silver. The cylinder 11 has an end provided with a connecting portion 111. The connecting portion 111 of the cylinder 11 has a recessed shape. The cylinder 11 has a side provided with at least one fixing portion 112 connected to the connecting portion 111. The fixing portion 112 of the cylinder 11 has a recessed shape. Preferably, the cylinder 11 is provided with two parallel fixing portions 112 each connected to the connecting portion 111.

The absorbing layer 12 has a hollow shape. The absorbing layer 12 is mounted on the outer periphery of the cylinder 11. Preferably, the absorbing layer 12 is made of absorbent material that absorbs and prevents high-frequency and low-frequency waves.

The tube 13 is made of aluminum and has a hollow shape. The tube 13 is mounted on an outer periphery of the absorbing layer 12.

The housing 14 has an outer periphery provided with an antiskid layer 144 which has a projecting or granular shape. The chamber 141 of the housing 14 has a recessed shape. The chamber 141 of the housing 14 is mounted on an outer periphery of the tube 13 and has a peripheral wall provided with a plurality of arcuate channels 143 surrounding and abutting the outer periphery of the tube 13 to fix the tube 13. Preferably, the arcuate channels 143 of the housing 14 are arranged in an annular manner. The mineral layer 142 is located between the housing 14 and the tube 13.

The cover 15 is provided with an opening 151 connected to the connecting portion 111 of the cylinder 11. The opening 151 is extended through a whole thickness of the cover 15.

Figure 5:
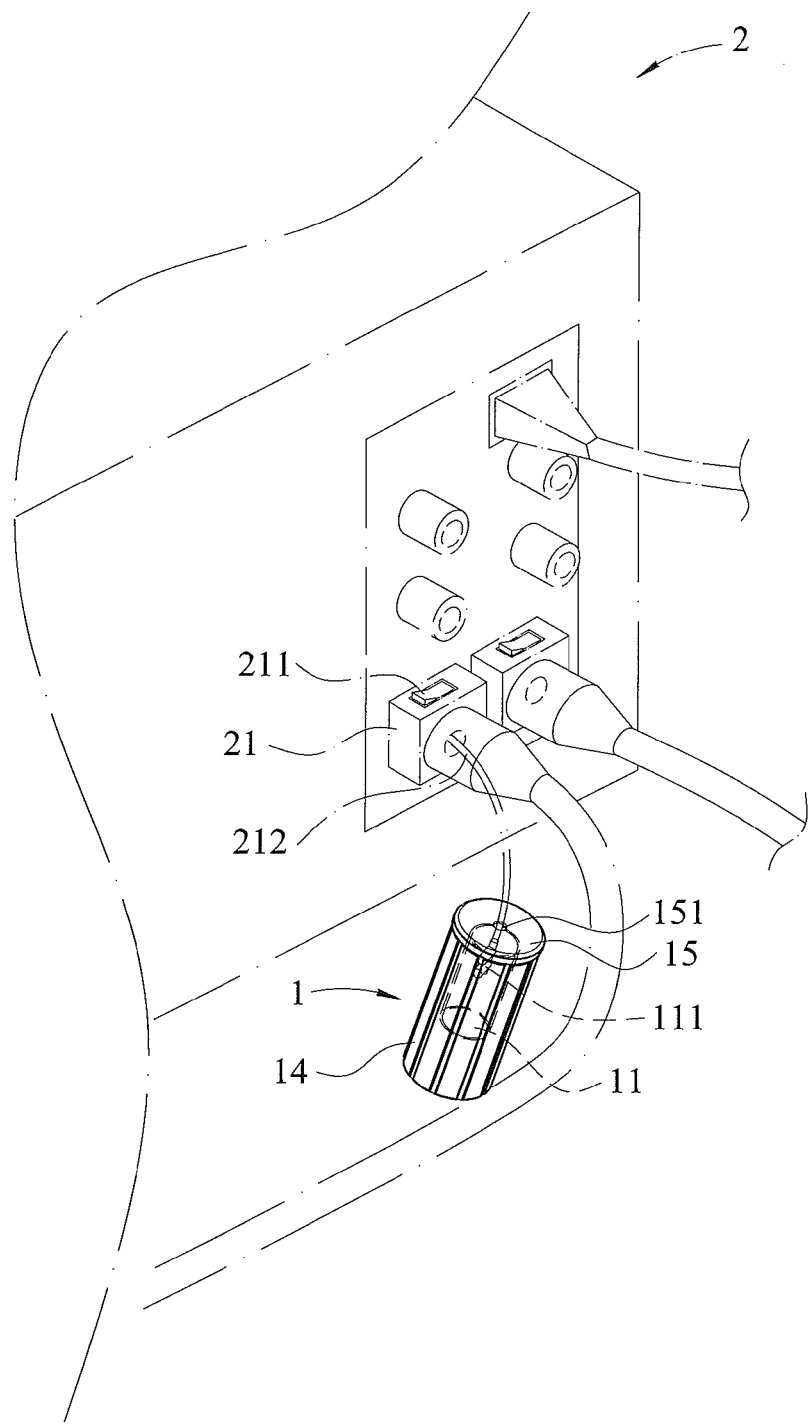
FIG. 5 is a schematic operational view of the noise suppression device in accordance with the preferred embodiment of the present invention.

In operation, referring to FIG. 5 with reference to FIGS. 1-4, the noise suppression device 1 is connected with a sound 2 which includes a negative electrode 21 and a separating line 212. The negative electrode 21 has a pressing terminal 211. The separating line 212 has a first end affixed to the negative electrode 21 by operation of the pressing terminal 211 and a second end affixed to the noise suppression device 1. The second end of the separating line 212 is extended through the opening 151 of the cover 15 into the connecting portion 111 of the cylinder 11 and is connected with the connecting portion 111 of the cylinder 11. A fastening member is extended through the fixing portion 112 of the cylinder 11 and presses the second end of the separating line 212 to affix the second end of the separating line 212 to the cylinder 11. In such a manner, the cylinder 11 is made of copper which has a small resistance coefficient to ground the sound 2, so that the sound 2 can discharge and release the induced charges produced by various radiation and electromagnetic induction. In addition, the absorbing layer 12 is made of absorbent material that absorbs and prevents high-frequency and low-frequency waves, while the mineral layer 142 is located between the housing 14 and the tube 13, so that the voltage noise produced by the sound 2 is oscillated in the noise suppression device 1, so as to achieve the purpose of eliminating the voltage noise.

Figure 6:
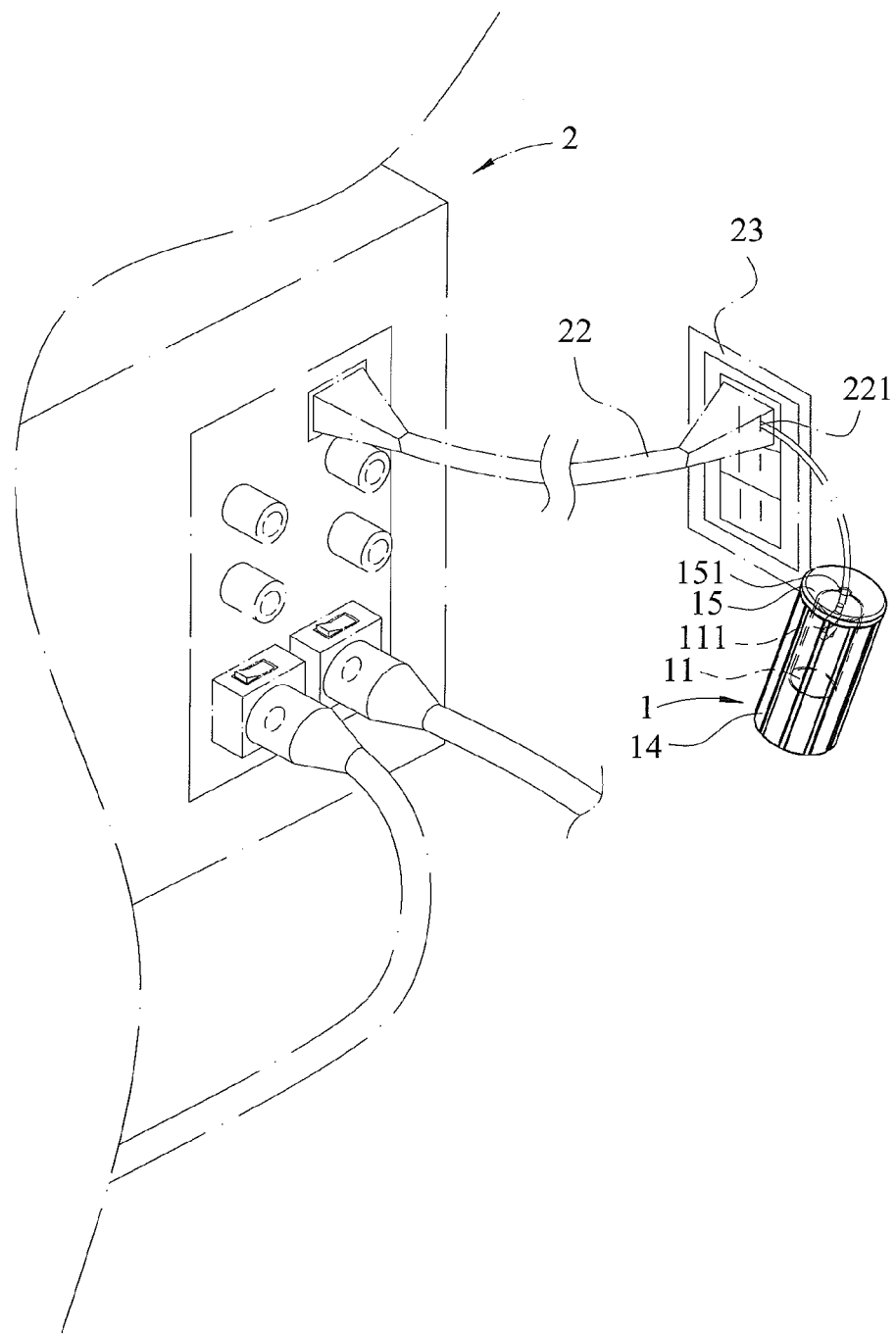
FIG. 6 is a schematic operational view of the noise suppression device in accordance with another preferred embodiment of the present invention.

Alternatively, referring to FIG. 6 with reference to FIGS. 1-4, the sound 2 further includes a power supply line 22 which has a negative electrode 221 connected to a socket 23. The noise suppression device 1 is connected with the negative electrode 221 of the power supply line 22 of the sound 2.

Accordingly, the noise suppression device 1 has an excellent grounding effect by provision of the cylinder 11 which is made of copper, so that when the noise suppression device 1 is connected with the sound 2, the sound 2 is grounded and can discharge and release the induced charges produced by various radiation and electromagnetic induction. In addition, the absorbing layer 12 absorbs high-frequency and low-frequency waves, while the mineral layer 142 is located between the housing 14 and the tube 13, so that the voltage noise produced in the acoustic signals of the sound 2 is oscillated in the noise suppression device 1, so as to achieve the purpose of eliminating the voltage noise.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

The invention claimed is:

1. A noise suppression device comprising:
a housing having an interior provided with a chamber;
a tube mounted in the chamber of the housing;
a mineral layer mounted in the chamber of the housing;
an absorbing layer mounted in the tube;
a cylinder mounted in the absorbing layer; and
a cover mounted on an opened end of the housing to close the housing; wherein:
the cylinder has an outer periphery provided with an electroplated layer;
the cylinder has an end provided with a connecting portion;
the absorbing layer is mounted on the outer periphery of the cylinder;
the tube is mounted on an outer periphery of the absorbing layer;
the chamber of the housing is mounted on an outer periphery of the tube; and
the cover is provided with an opening connected to the connecting portion of the cylinder.

2. The noise suppression device of claim 1, wherein the cylinder has a side provided with at least one fixing portion connected to the connecting portion.

3. The noise suppression device of claim 1, wherein the cylinder is made of copper.

4. The noise suppression device of claim 1, wherein the electroplated layer of the cylinder is made of silver.

5. The noise suppression device of claim 1, wherein the absorbing layer is made of absorbent material that absorbs and prevents high-frequency and low-frequency waves.

6. The noise suppression device of claim 1, wherein the tube is made of aluminum.

7. The noise suppression device of claim 1, wherein the chamber of the housing has a peripheral wall provided with a plurality of arcuate channels surrounding and abutting the outer periphery of the tube to fix the tube.

8. The noise suppression device of claim 1, wherein the housing has an outer periphery provided with an antiskid layer.

* * * * *